United States Patent
Antunez et al.

(10) Patent No.: US 10,217,888 B2
(45) Date of Patent: Feb. 26, 2019

(54) SOLUTION-PHASE INCLUSION OF SILVER INTO CHALCOGENIDE SEMICONDUCTOR INKS

(71) Applicant: International Business Machines Corporation, Armonk, NY (US)

(72) Inventors: Priscilla D. Antunez, Tarrytown, NY (US); Talia S. Gershon, White Plains, NY (US); Richard A. Haight, Mahopac, NY (US); Teodor K. Todorov, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 119 days.

(21) Appl. No.: 15/287,087

(22) Filed: Oct. 6, 2016

(65) Prior Publication Data

US 2018/0102455 A1 Apr. 12, 2018

(51) Int. Cl.
| | |
|---|---|
| *H01B 1/06* | (2006.01) |
| *H01L 31/0749* | (2012.01) |
| *C09D 11/52* | (2014.01) |
| *H01L 31/02* | (2006.01) |
| *H01L 31/18* | (2006.01) |
| *H01L 31/032* | (2006.01) |

(52) U.S. Cl.
CPC .......... *H01L 31/0749* (2013.01); *C09D 11/52* (2013.01); *H01B 1/06* (2013.01); *H01L 31/02008* (2013.01); *H01L 31/0322* (2013.01); *H01L 31/0326* (2013.01); *H01L 31/18* (2013.01)

(58) Field of Classification Search
CPC .............. C09D 11/52; H01L 31/02008; H01L 31/0322; H01L 31/0326; H01L 31/0749; H01L 31/18; H01B 1/06
See application file for complete search history.

(56) References Cited

U.S. PATENT DOCUMENTS

| | | | |
|---|---|---|---|
| 2,592,250 A | 4/1952 | Davey et al. | |
| 8,470,636 B2 * | 6/2013 | Radu ..................... | B82Y 30/00 257/E31.004 |
| 8,546,176 B2 | 10/2013 | Lee et al. | |
| 9,028,723 B2 | 5/2015 | Torimoto et al. | |

(Continued)

OTHER PUBLICATIONS

D.B. Mitzi et al., "High-mobility ultrathin semiconducting films prepared by spin coating," Nature, vol. 428, No. 6980, Mar. 2004, pp. 299-303.

(Continued)

*Primary Examiner* — Mark Kopec
*Assistant Examiner* — Jaison P Thomas
(74) *Attorney, Agent, or Firm* — Vazken Alexanian; Michael J. Chang, LLC

(57) ABSTRACT

Silver-containing absorbers for photovoltaic devices and techniques for fabrication thereof are provided. In one aspect, a method of forming an ink includes: mixing a silver halide and a solvent to form a first solution; mixing a metal, sulfur, and the solvent to form a second solution; combining the first solution and the second solution to form a precursor solution; and adding constituent components for an absorber material to the precursor solution to form the ink. Methods of forming an absorber film, a photovoltaic device, and the resulting photovoltaic device are also provided.

21 Claims, 8 Drawing Sheets

(56) References Cited

U.S. PATENT DOCUMENTS

| | | | |
|---|---|---|---|
| 9,252,304 B2 | 2/2016 | Todorov | |
| 9,876,130 B1* | 1/2018 | Gershon | H01L 31/0326 |
| 9,997,655 B1* | 6/2018 | Gershon | H01L 31/0326 |
| 2008/0277630 A1* | 11/2008 | Kiyoshima | A61K 8/02 |
| | | | 252/514 |
| 2012/0220066 A1* | 8/2012 | Cao | H01L 21/02568 |
| | | | 438/73 |
| 2012/0270363 A1* | 10/2012 | Jackrel | C23C 18/1204 |
| | | | 438/95 |
| 2012/0313200 A1* | 12/2012 | Jackrel | H01L 31/0322 |
| | | | 257/431 |
| 2014/0096826 A1 | 4/2014 | Todorov | |
| 2014/0116512 A1 | 5/2014 | Yang et al. | |
| 2014/0186995 A1* | 7/2014 | Liang | H01L 31/0322 |
| | | | 438/102 |
| 2014/0220728 A1* | 8/2014 | Hillhouse | H01L 31/0326 |
| | | | 438/95 |
| 2015/0136216 A1* | 5/2015 | Kurihara | H01L 31/0326 |
| | | | 136/256 |
| 2016/0155867 A1 | 6/2016 | Kuwahara et al. | |
| 2017/0306169 A1* | 10/2017 | Liao | C01B 19/007 |

OTHER PUBLICATIONS

P.D. Antunez et al., "Low temperature solution-phase deposition of SnS thin films," Chemistry of Materials, vol. 26, No. 19, Sep. 2014, pp. 5444-5446.

D.H. Webber et al., "Facile dissolution of selenium and tellurium in a thiol—amine solvent mixture under ambient conditions," Chemical Science, vol. 5, No. 6, Apr. 2014, pp. 2498-2502.

L.-Y. Yeh et al., "Preparation of the Ag—Zn—Sn—S quaternary photoelectrodes using chemical bath deposition for photoelectrochemical applications." Thin Solid Films, vol. 558, Feb. 2014, pp. 289-293.

Wei et al., "Synthesis and Characterization of Nanostructured Stannite Cu2ZnSnSe4 and Ag2ZnSnSe4 for Thermoelectric Applications," ACS Appl. Mater. Interfaces, Apr. 2015, 7, 9752-9757.

T. Gershon et al., "Photovoltaic Materials and Devices Based on the Alloyed Kesterite Absorber (AgxCu1-x) 2ZnSnSe4," Advanced Energy Materials, Mar. 2016, 1502468, 7 pages.

Mitzi et al., "Prospects and performance limitations for Cu—Zn—Sn—S—Se photovoltaic technology," Phil Trans R Soc A 371 pp. 1-22 (Jul. 2013).

* cited by examiner

| Ag (at%) | Eff (%) | FF (%) | Voc (mV) | Jsc (mA/cm$^2$) |
|---|---|---|---|---|
| 0% Ag | 9.4 | 61.8 | 452.2 | 33.4 |
| 1% Ag | 10.5 | 66.4 | 451.3 | 34.9 |
| 5% Ag | 8.6 | 54.7 | 418.9 | 37.5 |
| 10% Ag | 8.1 | 62.7 | 444.0 | 29.1 |

SOLUTION-PHASE INCLUSION OF SILVER INTO CHALCOGENIDE SEMICONDUCTOR INKS

STATEMENT OF GOVERNMENT RIGHTS

This invention was made with Government support under Contract number DE-EE0006334 awarded by Department of Energy. The Government has certain rights in this invention.

FIELD OF THE INVENTION

The present invention relates to photovoltaic devices and more particularly, to silver (Ag)-containing absorbers for photovoltaic devices and techniques for fabrication thereof.

BACKGROUND OF THE INVENTION

Thin film solar cell absorbers composed of earth-abundant elements such as $Cu_2ZnSn(S,Se)_4$ (CZT(S,Se)) are particularly relevant due to their relatively low toxicity and their record maximum power conversion efficiency of 12.6%. Despite promising results, further work is however needed to understand how to improve this technology and enable its commercial-scale implementation.

Recent efforts have identified the need to remove defect states by deliberate passivation or the introduction of dopants in order to improve upon the voltage deficits (compared to theoretical limits) exhibited by CZT(S,Se). The inclusion of silver could reduce tail states that are introduced by the disorder caused in the random alternation of copper and zinc in the kesterite lattice (the copper cation is only 5% larger than the zinc cation). The inclusion of silver has been shown to reduce antisite defects in CZT(S,Se) absorbers by approximately an order of magnitude.

One process to incorporate silver in CZT(S,Se) involves evaporating silver after the deposition of the absorber. This technique can however compromise absorber quality by exposing it to air.

An alternative method involves nanoparticle synthesis. See, for example, Wei et al., "Synthesis and Characterization of Nanostructured Stannite $Cu_2ZnSnSe_4$ and $Ag_2ZnSnSe_4$ for Thermoelectric Applications," ACS Appl. Mater. Interfaces, April 2015, 7, 9752-9757. However, this synthesis procedure requires extensive processing and multiple purification steps which in turn lead to extremely low yields of nanoparticles. Further, the native ligands that surround the particles are insulating and thus yield low quality devices.

Accordingly, improved techniques for incorporating silver into absorber materials like CZT(S,Se) would be desirable.

SUMMARY OF THE INVENTION

The present invention provides silver (Ag)-containing absorbers for photovoltaic devices and techniques for fabrication thereof. In one aspect of the invention, a method of forming an ink is provided. The method includes: mixing a silver halide and a solvent to form a first solution; mixing a metal, sulfur, and the solvent to form a second solution; combining the first solution and the second solution to form a precursor solution; and adding constituent components for an absorber material to the precursor solution to form the ink.

In another aspect of the invention, a method of forming an absorber film is provided. The method includes: forming an ink by: i) mixing a silver halide and a solvent to form a first solution, ii) mixing a metal, sulfur, and the solvent to form a second solution, iii) combining the first solution and the second solution to form a precursor solution, iv) adding constituent components for an absorber material to the precursor solution to form the ink; depositing the ink onto a substrate to form the absorber film on the substrate; and annealing the absorber film.

In yet another aspect of the invention, a method of forming a photovoltaic device is provided. The method includes: forming an electrically conductive layer on a substrate; forming an absorber layer on the electrically conductive layer by: i) mixing a silver halide and a solvent to form a first solution, ii) mixing a metal, sulfur, and the solvent to form a second solution, iii) combining the first solution and the second solution to form precursor solution, iv) adding constituent components for an absorber material to the precursor solution to form an ink, v) depositing the ink onto the electrically conductive layer to form the absorber layer on the electrically conductive layer; annealing the absorber layer; forming a buffer layer on the absorber layer; forming a transparent front contact on the buffer layer; and forming a metal grid on the transparent front contact.

In still yet another aspect of the invention, a photovoltaic device is provided. The photovoltaic device includes: a substrate; an electrically conductive layer on the substrate; an absorber layer on the electrically conductive layer, wherein the absorber layer comprises silver and a halide, and wherein the silver and the halide are both present throughout the absorber layer; a buffer layer on the absorber layer; a transparent front contact on the buffer layer; and a metal grid on the transparent front contact.

A more complete understanding of the present invention, as well as further features and advantages of the present invention, will be obtained by reference to the following detailed description and drawings.

BRIEF DESCRIPTION OF THE DRAWINGS

prepared in accordance with the present techniques according to an embodiment of the present invention; and FIG. 10 is a diagram illustrating characteristics of photovoltaic devices prepared according to the present techniques with varying amounts of Ag as compared to a standard device as a control according to an embodiment of the present invention.

DETAILED DESCRIPTION OF PREFERRED EMBODIMENTS

Provided herein are solution-based techniques for incorporating silver (Ag) directly into the precursor solutions of CIG(S,Se), CZT(S,Se) and/or CIS materials. Advantageously, the present techniques allow the inclusion of Ag in solution without having to expose the material to air. Further, the solution processing of thin film solar absorbers can enable the commercial scale implementation of materials like the earth-abundant, non-toxic CZT(S,Se) absorber.

As its name implies, CZT(S,Se) is a kesterite absorber material containing copper (Cu), zinc (Zn), tin (Sn), and at least one of sulfur (S) and selenium (Se). For a general discussion on kesterites and use of kesterite in solar cells, see, for example, Mitzi et al., "Prospects and performance limitations for Cu—Zn—Sn—S—Se photovoltaic technology," Phil Trans R Soc A 371 (July 2013), the contents of which are incorporated by reference as if fully set forth herein.

A CIG(S,Se) absorber material contains Cu, indium (In), gallium (Ga), and at least one of S and Se. A CIS absorber material includes Cu, In, and Se. The term "absorber" refers to the use of these materials as the absorber layer in photovoltaic devices. An exemplary photovoltaic device having a CIG(S,Se), CZT(S,Se) and/or CIS absorber layer formed using the present techniques will be described below.

A notable challenge to including silver into these materials is that silver reacts aggressively with sulfur, instantly forming silver sulfide ($Ag_2S$), which is undesirable. Advantageously, it has been found herein that if one first coordinates the sulfur with a metal such as copper thereby making the sulfur less reactive, then the Ag can be introduced without $Ag_2S$ formation. While copper is a suitable choice for any of the above absorber materials, any metal can be employed for coordination of the sulfur.

In general, the present techniques involve separately preparing mixtures of i) a silver halide such as silver chloride (AgCl) silver bromide (AgBr) or silver iodide (AgI) and ii) Cu and S in a solvent such as hydrazine or thiolamine. After the constituent components have dissolved, the mixtures (i) and (ii) are then combined. This precursor solution can then be integrated with other constituent (e.g., CIG(S,Se), CZT(S,Se) and/or CIS) components to form an ink which can then be applied during fabrication of the photovoltaic device absorber.

Figure 1:
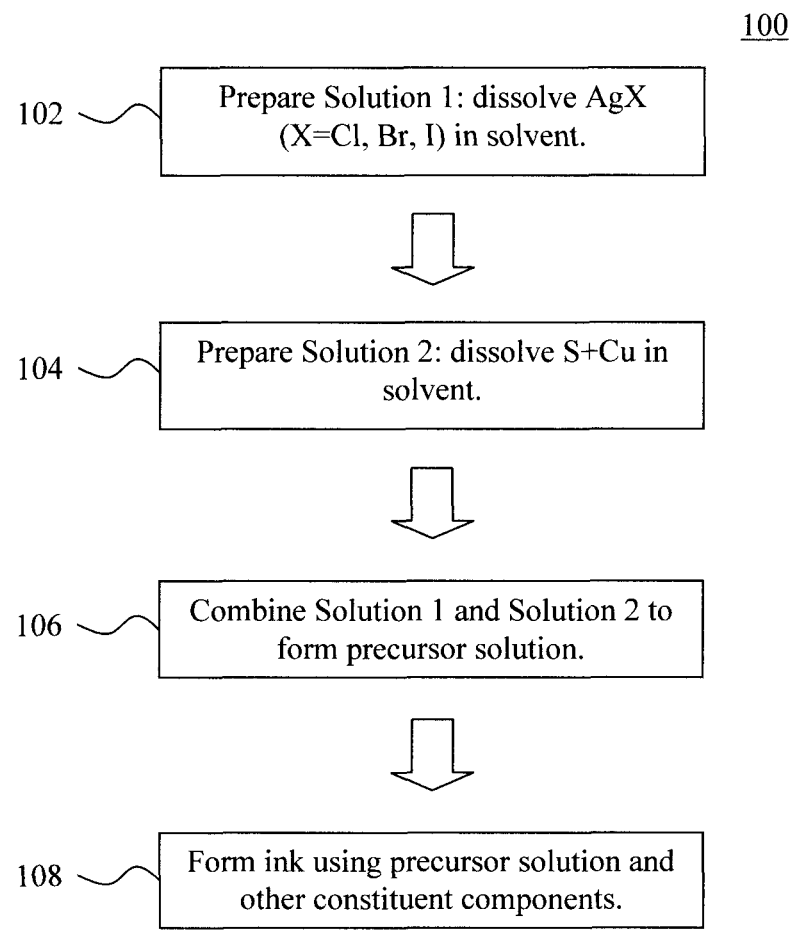
FIG. 1 is a diagram illustrating an exemplary methodology for forming an ink according to an embodiment of the present invention.

The present techniques are now described in detail by way of reference to methodology 100 of FIG. 1 for forming an ink. In step 102, a first solution (Solution 1) is prepared by mixing a silver halide and a solvent. According to an exemplary embodiment, the silver halide is AgX, wherein X=Cl, Br, or I. Suitable solvents include, but are not limited to, hydrazine, and thiol-amine solvents such as 11-Amino-1-undecanethiol hydrochloride.

According to an exemplary embodiment, the solvent is first cooled to a temperature of from about −5° C. to about −2° C., and ranges therebetween. The silver halide salt is then added to the cooled solvent, and the solution is mixed using, e.g., 30 minutes of vigorous stirring, until the silver halide salt is uniformly dispersed in the solvent.

In step 104, in a separate vial a second solution (Solution 2) is prepared by mixing a metal, sulfur, and the solvent. Again the solvent (e.g., hydrazine or thiol-amine) is first cooled to a temperature of from about −5° C. to about −2° C., and ranges therebetween. The metal and sulfur are then added to the cooled solvent, and the solution is mixed using, e.g., 30 minutes of vigorous stirring, until the metal and sulfur have uniformly dispersed in the solvent. As described above, the metal will coordinate the sulfur, making it less reactive when the silver is later added (see below). According to an exemplary embodiment, the metal is copper. Copper is a preferred choice since the resulting precursor solution can then be used to form any of the above absorber materials. However, any other suitable metals may be employed, such as, indium (In), gallium (Ga), zinc (Zn), tin (Sn), etc.

By way of example only, the following formulation may be used to create a 1% Ag-containing CZT(S,Se) ink:

Cu 676 milligrams (mg)
AgI 25 mg
Sn 714 mg
S 504 mg
zinc formate 1.070 grams (g)
Se 3.00 g, wherein 4 milliliters (mL) of hydrazine are used to dissolve/coordinate $Cu_2S$, and 8 mL of hydrazine is used for the rest of the material. In this example, the Cu is used to coordinate the S, and however much Ag is added is subtracted from the amount of Cu. Thus, if more Ag is added to the formulation, then the amount of Cu is reduced. As described below, the 1% Ag devices exhibited efficiencies of 10.5%.

In step 106, Solution 1 and Solution 2 are combined (i.e., mixed) to form a precursor solution. When combined, Solution 1 and Solution 2 will bubble, and it is preferable to wait until the bubbling has stopped, e.g., about 3 minutes, before proceeding to the next step.

In step 108, the precursor solution is used to form an ink with other constituent components of the given absorber material. For instance, for a CZT(S,Se) absorber one would add zinc (Zn), tin (Sn), and sulfur (S) and/or selenium (Se). Each element can be weighed separately and added to the precursor solution. For a CIGS ink, one would add indium (In), gallium (Ga), sulfur (S) and/or selenium (Se), while for a CIS ink one would add indium (In), and selenium (Se).

Figure 2:
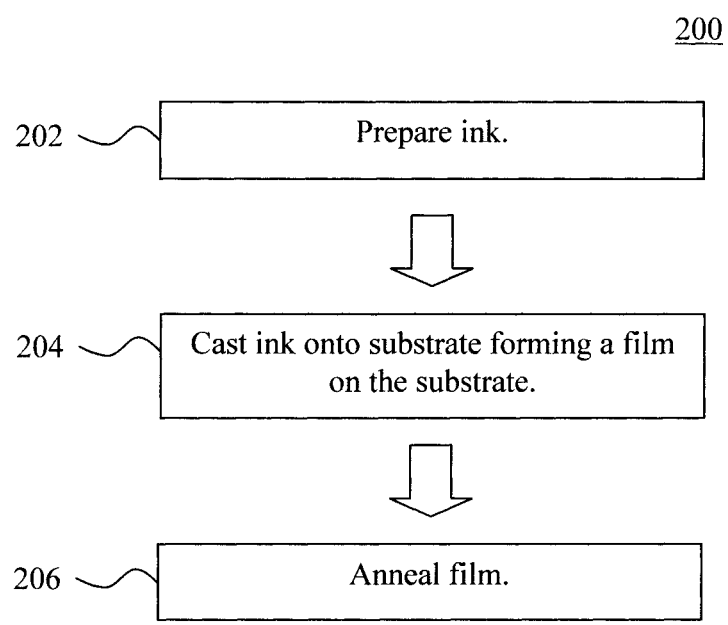
FIG. 2 is a diagram illustrating an exemplary methodology for forming an absorber film according to an embodiment of the present invention.

The ink can then be used to form a film of the respective absorber material. See, for example, methodology 200 of FIG. 2. For instance, in step 202, the ink is prepared as described above in accordance with methodology 100. Of course, the constituent components added to the precursor solution will depend on the desired composition of the absorber film, e.g., CZT(S,Se), CIGS, CIS, etc. As described above, the process involves separately mixing i) the sulfur with a metal (which makes the sulfur less reactive) and ii) a silver halide in a suitable solvent (e.g., hydrazine or thiol-amine). While any of the above-described metals can be used in this manner to coordinate the sulfur, copper is a good choice since it is the basis for all three of the absorber materials.

In step 204, the ink is then deposited (i.e., cast) onto a substrate, forming a film on the substrate. Suitable casting processes include, but are not limited to spray coating, spin coating, ink jet printing, etc.

According to an exemplary embodiment, the present techniques are implemented in the fabrication of a photovoltaic device where the (e.g., CZT(S,Se), CIGS, CIS) film serves as the absorber layer of the device. As will be described in detail below, in that case, the substrate can be an electrically conductive substrate, such as a molybdenum (Mo)-coated glass substrate.

In step 206, the film is annealed. Annealing serves to improve the grain structure of the film. According to an exemplary embodiment, the anneal is performed at a temperature of from about 400 degrees Celsius (° C.) to about 800° C., and ranges therebetween, for a duration of from about 100 seconds to about 120 seconds, and ranges therebetween. Preferably, the annealing is performed in an environment containing excess chalcogen (e.g., sulfur (S) and/or selenium (Se)) which serves to replace these volatile elements lost during heating.

Figure 3:
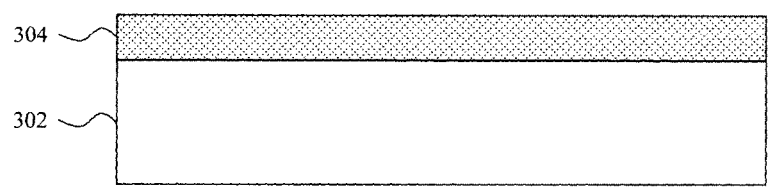
FIG. 3 is a cross-sectional diagram illustrating a substrate and an electrically conductive layer on the substrate according to an embodiment of the present invention.
Figure 4:
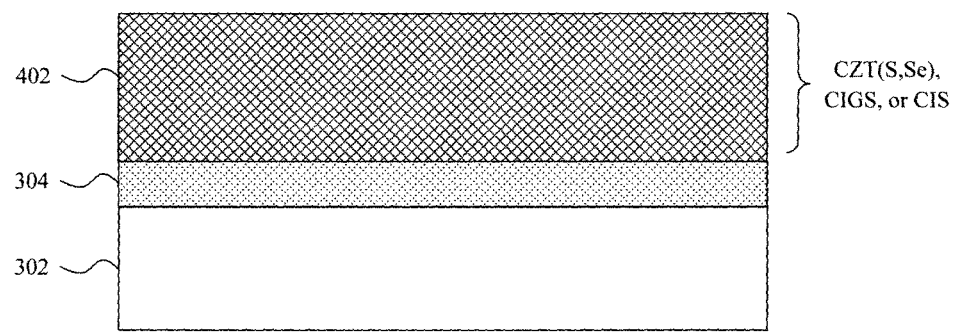
FIG. 4 is a cross-sectional diagram illustrating an absorber layer having been formed on the electrically conductive layer according to an embodiment of the present invention.

According to an exemplary embodiment, the present techniques are employed in the fabrication of a photovoltaic device. This exemplary embodiment is now described by way of reference to FIGS. 3-7. As shown in FIG. 3, the process begins with a substrate 302 coated with a layer 304 (or optionally multiple layers represented generically by layer 304) of an electrically conductive material.

Suitable substrates 302 include, but are not limited to, glass (e.g., soda lime glass (SLG)), ceramic, metal foil, or plastic substrates. Suitable materials for forming (electrically) conductive layer 304 include, but are not limited to, molybdenum (Mo), molybdenum trioxide ($MoO_3$), gold (Au), nickel (Ni), tantalum (Ta), tungsten (W), aluminum (Al), platinum (Pt), titanium nitride (TiN), silicon nitride (SiN), and combinations including at least one of the foregoing materials (for example as an alloy of one or more of these metals or as a stack of multiple layers such as $MoO_3$+Au).

According to an exemplary embodiment, the conductive layer 304 is coated on substrate 302 to a thickness of greater than about 0.1 micrometers (μm), e.g., from about 0.1 μm to about 2.5 μm, and ranges therebetween. In general, the various layers of the device will be deposited sequentially using a combination of vacuum-based and/or solution-based approaches. By way of example only, the electrically conductive material 304 can be deposited onto the substrate 302 using evaporation or sputtering.

Next, an absorber layer 402 is formed on the conductive layer 304. The absorber layer 402 is formed according to the processes described in conjunction with the description of FIGS. 1 and 2, above. Namely, an ink is prepared in accordance with methodology 100 (of FIG. 1) which involves separately mixing i) the sulfur with a metal (which makes the sulfur less reactive) and ii) a silver halide in a suitable solvent (e.g., hydrazine or thiol-amine). The solutions are then combined into a precursor solution to which constituent components are added to form an ink. The constituent components added will tailor the composition of the absorber layer 402. For instance, as provided above, for a CZT(S,Se) absorber one would add Zn, Sn, and S and/or Se. Each element can be weighed separately and added to the precursor solution. For a CIGS ink, one would add In, Ga, S and/or Se, while for a CIS ink one would add In, and Se. See, for example, FIG. 4 where it is indicated that the absorber layer 402 can be a CZT(S,Se), CIGS, or CIS film.

Next, in accordance with methodology 200 (of FIG. 2), the ink is cast (e.g., using spray coating, spin coating, ink jet printing, etc.) onto the substrate 302/conductive layer 304, forming absorber layer 402 on the conductive layer 304. According to an exemplary embodiment, the absorber layer 402 is a film having a thickness of from about 0.5 micrometers (μm) to about 2 μm, and ranges therebetween.

Since the as-deposited materials have poor grain structure and a lot of defects, following deposition of the absorber layer 402 a post anneal in a chalcogen (e.g., S and/or Se) environment is preferably performed. An anneal in a chalcogen environment improves the grain structure and defect landscape in the absorber material. As provided above, suitable conditions for the anneal include a temperature of from about 400 degrees ° C. to about 800° C., and ranges therebetween, for a duration of from about 100 seconds to about 120 seconds, and ranges therebetween.

As will be described in detail below, due to the unique nature of the present process, the absorber layer 402 will have a unique composition. For instance, the presence of halide (i.e., Cl, Br, or I) in the precursor solution will translate to the final film composition, wherein a relatively uniform composition of the halide can be found throughout the absorber film. See below.

Figure 5:
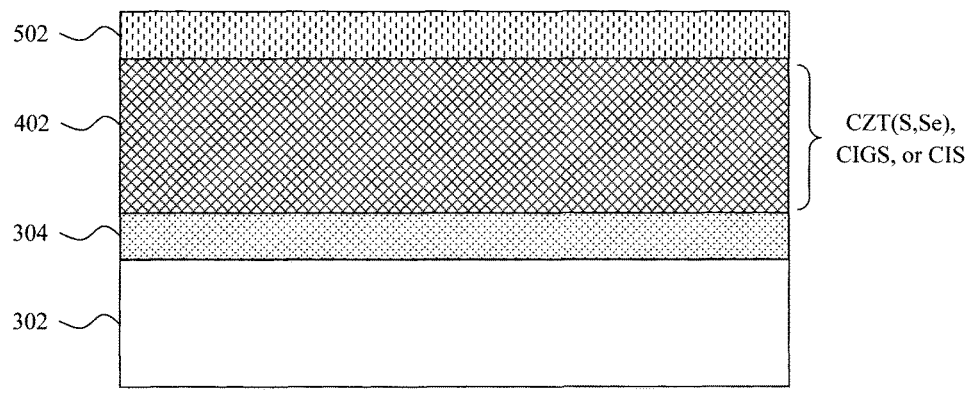
FIG. 5 is a cross-sectional diagram illustrating a buffer layer having been formed on the absorber layer according to an embodiment of the present invention.

As shown in FIG. 5, a buffer layer 502 is then formed on the absorber layer 402. See FIG. 5. The buffer layer 502 forms a p-n junction with the absorber layer 402. According to an exemplary embodiment, the buffer layer 502 is formed having a thickness of from about 100 angstroms (Å) to about 1,000 Å, and ranges therebetween.

Suitable buffer layer materials include, but are not limited to, cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), and/or aluminum oxide ($Al_2O_3$). According to an exemplary embodiment, the buffer layer 502 is deposited on the absorber layer 402 using standard chemical bath deposition.

Figure 6:
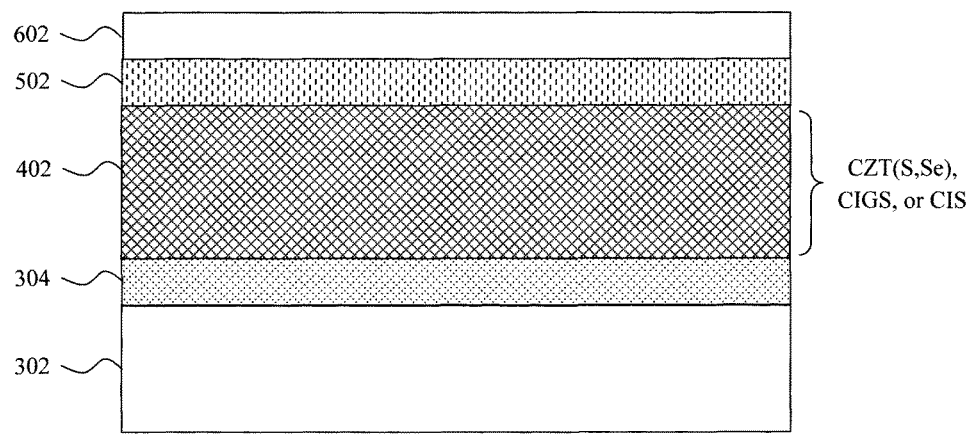
FIG. 6 is a cross-sectional diagram illustrating a transparent front contact having been formed on the buffer layer according to an embodiment of the present invention.
Figure 7:
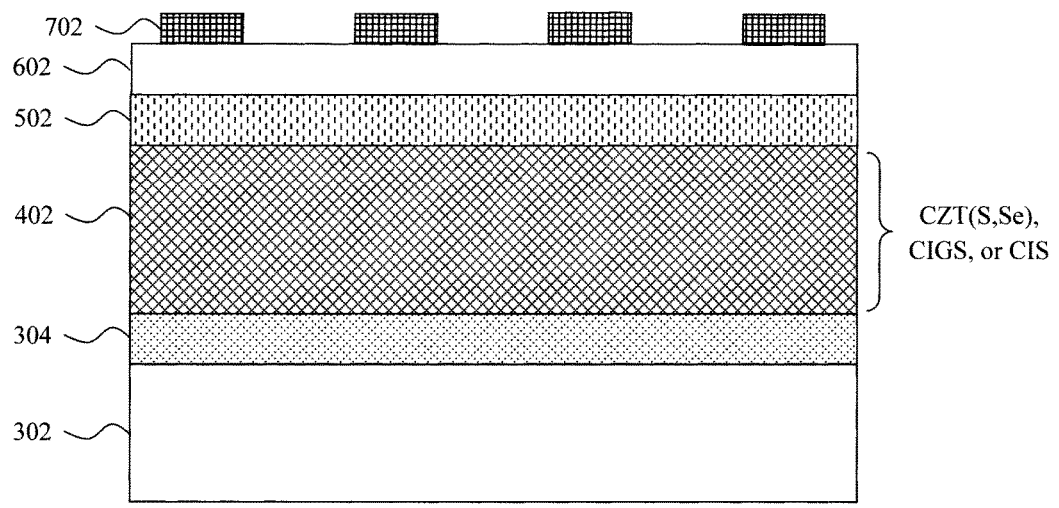
FIG. 7 is a cross-sectional diagram illustrating a metal grid having been formed on the transparent front contact according to an embodiment of the present invention.

As shown in FIG. 6, a transparent front contact 602 is then formed on the buffer layer 502. Suitable transparent front contact materials include, but are not limited to, transparent conductive oxides (TCOs) such as indium-tin-oxide (ITO) and/or aluminum (Al)-doped zinc oxide (ZnO) (AZO). According to an exemplary embodiment, the transparent front contact 602 is formed on the buffer layer 502 by sputtering.

Finally, a metal grid 702 is formed on the transparent front contact 602. See FIG. 7. Suitable materials for forming the metal grid 702 include, but are not limited to, nickel (Ni) and/or aluminum (Al). According to an exemplary embodiment, the metal grid 702 is formed on the transparent front contact 602 using evaporation or sputtering. Reference will be made below to a front contact and a back contact. The front contact is the transparent front contact 602 and the back contact is the electrically conductive layer 304.

Based on the composition of the precursor solution used in the absorber film formation (see above) one would expect a commensurate composition in the final film. For instance, based on the inclusion of a halide salt (e.g., silver chloride (AgCl), silver bromide (AgBr), or silver iodide (AgI)) in the precursor solution, one would expect to see the respective halide distributed throughout the film. This is in fact the result. See, for example, FIG. 8.

Figure 8:
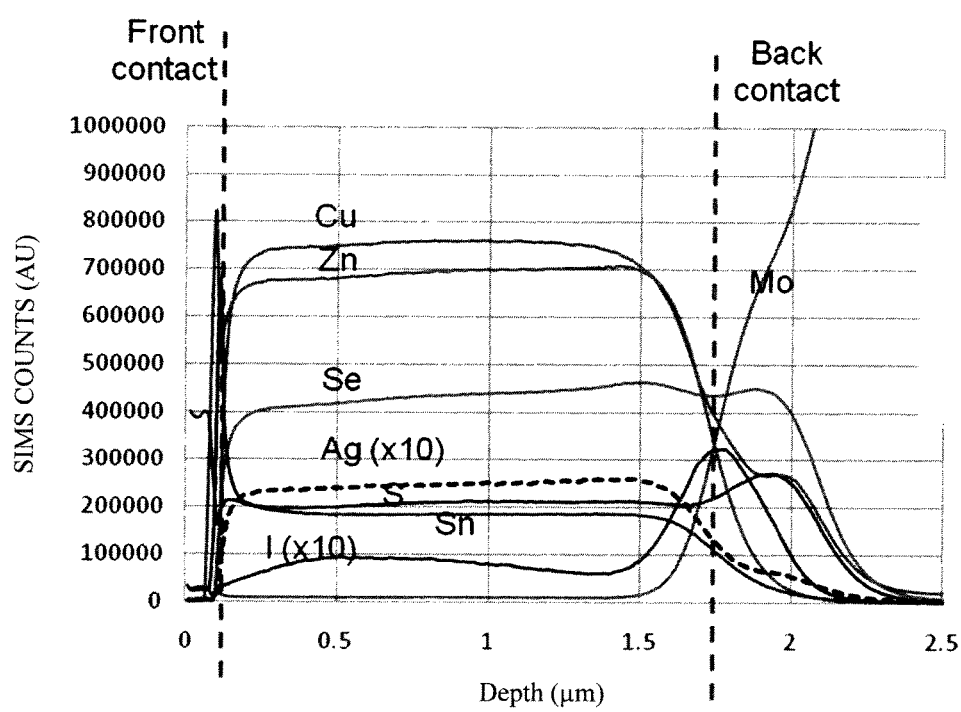
FIG. 8 is a diagram illustrating the composition of a silver (Ag)-containing CZT(S,Se) film prepared in accordance with the present techniques according to an embodiment of the present invention.

FIG. 8 is a diagram illustrating the composition of a CZT(S,Se) absorber film prepared in accordance with the present techniques. In this example, the silver halide employed in the precursor solution is silver iodide (AgI). Depth (measured in micrometers (μm)) from the front contact to the back contact is plotted on the x-axis, and Secondary Ion Mass Spectrometry (SIMS) counts (measured in arbitrary units (AU)) is plotted on the y-axis. As shown in FIG. 8, there is a constant Ag intensity (dashed line) throughout the film. Also, while the halide composition (in this case iodide (I)) does fluctuate depending on the depth, the halide is present throughout the entire film. As provided above, this is a unique result of the present process due to the silver halide component of the precursor ink solution.

Figure 9:
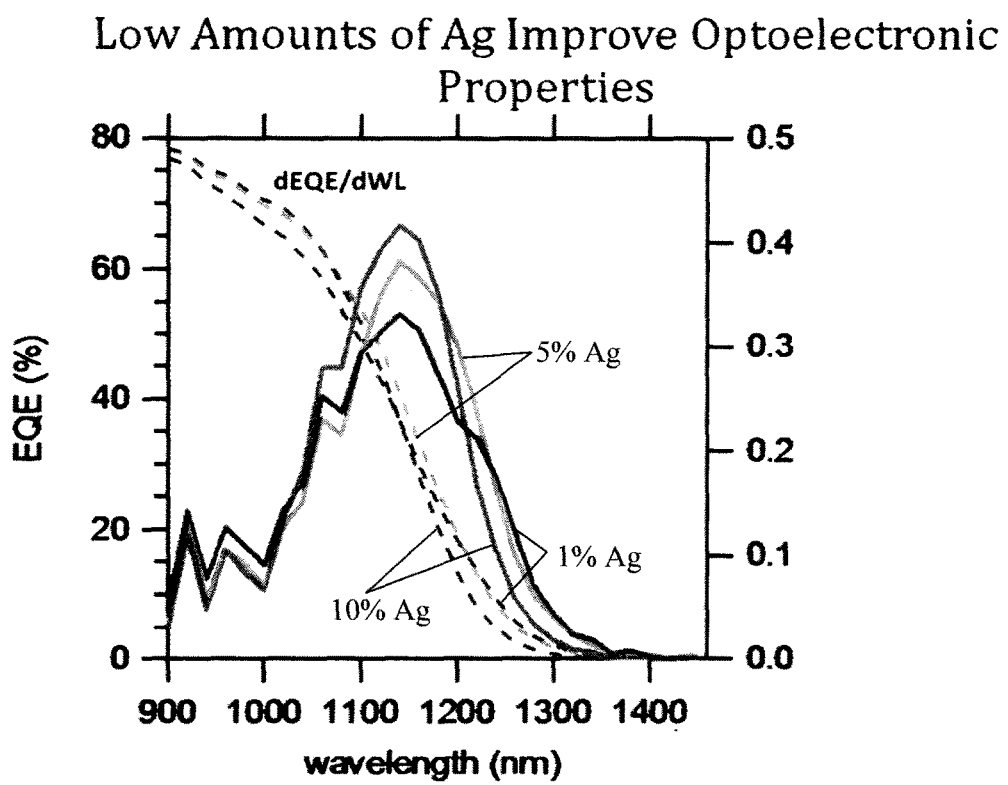
FIG. 9 is a diagram illustrating the optoelectronic properties of absorber films (with varying amounts of Ag)

FIG. 9 is a diagram illustrating how the inclusion of small amounts of Ag have a marked impact on the optoelectronic properties of the respective (in this example a CZT(S,Se)) absorber film. In FIG. 9, wavelength (measured in nanometers (nm)) is plotted on the x-axis, and external quantum efficiency (EQE (measured in percent (%)) is plotted on the y-axis. Samples containing 1%, 5%, and 10% Ag show successive increases in device efficiency, which is especially apparent at wavelengths from 1100 nm to 1200 nm.

FIG. 10 further illustrates the benefits of the present Ag-containing absorber films over their 0% Ag counterparts. The films in this example were CZT(S,Se) prepared using the present techniques with varying amounts of Ag (i.e., 1% Ag, 5% Ag, and 10% Ag) and the same film without Ag (0% Ag) was prepared as a control. As shown in FIG. 10, the sample with 1% Ag had a power conversion efficiency (PCE) of 10.5%, a fill factor (FF) of 66.4%, an open circuit voltage (Voc) of 451.3 millivolts (mV), and a short circuit current (Jsc) of 34.9 milliamps per square centimeter (mA/cm$^2$).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an ink, the method comprising:
   mixing a silver halide and a solvent to form a first solution;
   mixing a metal, sulfur, and the solvent to form a second solution;
   combining the first solution and the second solution to form a precursor solution; and
   adding constituent components for an absorber material to the precursor solution to form the ink.

2. The method of claim 1, wherein the silver halide is selected from the group consisting of: silver chloride, silver bromide, and silver iodide.

3. The method of claim 1, wherein the solvent is selected from the group consisting of: hydrazine, and a thiol-amine solvent.

4. The method of claim 1, wherein the solvent comprises 11-Amino-1-undecanethiol hydrochloride.

5. The method of claim 1, wherein the metal is selected from the group consisting of: copper, indium, gallium, zinc, and tin.

6. The method of claim 1, wherein the metal comprises copper.

7. The method of claim 1, further comprising:
   cooling the solvent to a temperature of from about −5° C. to about −2° C., and ranges therebetween prior to forming the first and second solutions.

8. The method of claim 1, wherein the constituent components for the absorber material comprise zinc, tin, and at least one of sulfur and selenium.

9. The method of claim 1, wherein the constituent components for the absorber material comprise indium, gallium, and at least one of sulfur and selenium.

10. The method of claim 1, wherein the constituent components for the absorber material comprise indium and selenium.

11. A method of forming an absorber film, the method comprising:
    forming an ink by: i) mixing a silver halide and a solvent to form a first solution, ii) mixing a metal, sulfur, and the solvent to form a second solution, iii) combining the first solution and the second solution to form a precursor solution, iv) adding constituent components for an absorber material to the precursor solution to form the ink;
    depositing the ink onto a substrate to form the absorber film on the substrate; and
    annealing the absorber film.

12. The method of claim 11, wherein the silver halide is selected from the group consisting of: silver chloride, silver bromide, and silver iodide.

13. The method of claim 11, wherein the metal is selected from the group consisting of: copper, indium, gallium, zinc, and tin.

14. The method of claim 11, wherein the constituent components for the absorber material comprise zinc, tin, and at least one of sulfur and selenium.

15. The method of claim 11, wherein the constituent components for the absorber material comprise indium, gallium, and at least one of sulfur and selenium.

16. The method of claim 11, wherein the constituent components for the absorber material comprise indium and selenium.

17. The method of claim 11, wherein the absorber film is annealed at a temperature of from about 400° C. to about 800° C., and ranges therebetween, for a duration of from about 100 seconds to about 120 seconds, and ranges therebetween.

18. A method of forming a photovoltaic device, the method comprising:
    forming an electrically conductive layer on a substrate;
    forming an absorber layer on the electrically conductive layer by: i) mixing a silver halide and a solvent to form a first solution, ii) mixing a metal, sulfur, and the solvent to form a second solution, iii) combining the first solution and the second solution to form a precursor solution, iv) adding constituent components for an absorber material to the precursor solution to form an ink, v) depositing the ink onto the electrically conductive layer to form the absorber layer on the electrically conductive layer;
    annealing the absorber layer;
    forming a buffer layer on the absorber layer;
    forming a transparent front contact on the buffer layer; and
    forming a metal grid on the transparent front contact.

19. The method of claim 18, wherein the constituent components for the absorber material comprise zinc, tin, and at least one of sulfur and selenium.

20. The method of claim 18, wherein the constituent components for the absorber material comprise indium, gallium, and at least one of sulfur and selenium.

21. The method of claim 18, wherein the constituent components for the absorber material comprise indium and selenium.

* * * * *